(12) United States Patent
Ko et al.

(10) Patent No.: US 6,541,361 B2
(45) Date of Patent: Apr. 1, 2003

(54) PLASMA ENHANCED METHOD FOR INCREASING SILICON-CONTAINING PHOTORESIST SELECTIVITY

(75) Inventors: Francis Ko, Taichung (TW); Sandy Chen, Hsin-Chu (TW); Charlie Lee, Hsin-Chu (TW)

(73) Assignee: Lam Research Corp., Fremont, CA (US)

( * ) Notice: Subject to any disclaimer, the term of this patent is extended or adjusted under 35 U.S.C. 154(b) by 0 days.

(21) Appl. No.: 09/894,649

(22) Filed: Jun. 27, 2001

(65) Prior Publication Data
US 2003/0003683 A1 Jan. 2, 2003

(51) Int. Cl.$^7$ .......................................... H01L 21/4763
(52) U.S. Cl. ..................... 438/585; 445/586; 445/591; 430/313
(58) Field of Search ................. 438/445, 585, 438/591–593

(56) References Cited

U.S. PATENT DOCUMENTS 6,140,023 A * 10/2000 Levinson et al. ........... 430/313
6,207,541 B1 * 3/2001 Das et al. .................. 438/585

OTHER PUBLICATIONS

Athaval et al., Pub. No.: US 2001/0053610A1, Pub. Date: Dec. 20,2001, Method of plasma etching thin films of difficult to dry etch.*

* cited by examiner

Primary Examiner—David Nelms
Assistant Examiner—Dung Anh Le
(74) Attorney, Agent, or Firm—Martine & Penilla, LLP (57) ABSTRACT

Provided is a method for increasing an etching selectivity of photoresist material. The method initiates with providing a substrate with a developed photoresist layer. The developed photoresist layer on the substrate is formulated to contain a hardening agent. Next, the substrate is exposed to a gas, where the gas is formulated to interact with the hardening agent. A portion of the developed photoresist layer is then converted to a hardened layer where the hardened layer is created by an interaction of the hardening agent with the gas. Some notable advantages of the discussed methods of increasing the selectivity of a photoresist include improved etch profile control. Additionally, by combining fabrication steps such as the hardening of the photoresist in an etch chamber, downstream etching processes may be performed without having to transfer the wafer to an additional chamber, thereby improving wafer throughput while minimizing handling.

20 Claims, 5 Drawing Sheets

PLASMA ENHANCED METHOD FOR INCREASING SILICON-CONTAINING PHOTORESIST SELECTIVITY

CROSS REFERENCE TO RELATED APPLICATIONS

This application is related to U.S. patent application Ser. No. 09/894,230, filed on the same day as the instant application and entitled "APPARATUS AND METHOD FOR ARGON PLASMA INDUCED ULTRAVIOLET LIGHT CURING STEP FOR INCREASING SILICON-CONTAINING PHOTORESIST SELECTIVITY." This application is hereby incorporated by reference.

BACKGROUND OF THE INVENTION

1. Field of the Invention

This invention relates generally to lithography and more particularly to a method and apparatus for increasing the selectivity of a silicon containing photoresist layer to improve profile control of etched features without decreasing wafer throughput.

2. Description of the Related Art

The ability to work selectively on small well defined areas of a substrate is paramount in the manufacture of semiconductor devices. In the continuing quest to achieve higher levels of performance and higher functional density of the semiconductor devices, the microelectronics industry is committed to applying new processes to further reduce the minimum feature sizes of the semiconductor devices.

As the feature sizes are reduced, the devices can become smaller or remain the same size but become more densely packed. As such, advances in lithographic technologies used to pattern the semiconductor devices must keep pace with the progress to reduce feature sizes, in order to allow for smaller and more dense. For example, one of the main ways to reduce the device critical dimensions (CD) through lithographic technologies has been to continually reduce the wavelength of the radiation used to expose the photoresist.

Sharp lithographic transmission becomes more of a challenge as wafers progress to higher density chips with shrinking geometries. Furthermore, as metallization transitions to dual damascene processes, lithography techniques to pattern holes or trenches in the dielectric become more critical. In particular, the photoresists employed in the lithographic techniques must provide for proper selectivity so that downstream etching processes yield sharp profiles.

Photoresists are typically polymeric materials consisting of multi-component formulations. Additionally, a photoresist may be applied as a single layer or as multiple layers where one of the layers contains silicon. Multi-layered photoresists tend to offer superior formation of a pattern, therefore, the multi-layered photoresists are desirable as semiconductor devices become smaller. However, resist compositions containing silicon have either failed to deliver adequate improvement in etch resistance or have had poor processing performance due to the unacceptable selectivity past the silicon containing layer.

As a result, there is a need to solve the problems of the prior art to improve the selectivity past the developed photoresist layer containing silicon, without simultaneously decreasing wafer throughput, so that during etching there is improved ability to distinguish between silicon containing photoresists and non silicon containing photoresists or the dielectric.

SUMMARY OF THE INVENTION

Broadly speaking, the present invention fills these needs by providing a photoresist layer that has been hardened to increase the selectivity of the hardened photoresist layer relative to an underlying photoresist or underlying dielectric. In addition, the hardening process may take place in an etch chamber so that the fabrication, e.g., etching steps, may be combined with treating processes to improve wafer throughput. It should be appreciated that the present invention can be implemented in numerous ways, including as an apparatus, a system, a device, or a method. Several inventive embodiments of the present invention are described below.

In one embodiment, an apparatus for exposing a photoresist-developed substrate is provided. In this embodiment, a chamber is included where the chamber has at least one gas inlet adapted to introduce a gas into the chamber. Also included is a support within the chamber. A substrate on the support where the substrate has at least one developed photoresist layer is included. The substrate is exposed to a curing environment within the chamber where the curing environment is defined through the introduction of the gas through the gas inlet and causing at least a portion of the developed photoresist layer to convert to a hardened layer.

In another embodiment of the invention an apparatus for curing a photoresist is provided. In this embodiment, a chamber having at least one gas inlet adapted for introducing a gas into the chamber and a support within the chamber are included. A substrate on the support where the substrate has a first photoresist layer and a second photoresist layer is included. The first photoresist layer is formulated to contain a hardening agent where the hardening agent interacts with the gas to form a hardened layer from a top region of the first photoresist layer.

In yet another embodiment of the invention, a method for increasing a selectivity of a photoresist is provided. The method initiates with providing a substrate with a developed photoresist layer, the developed photoresist layer being formulated to contain a hardening agent. Next, the substrate is exposed to a gas, where the gas is formulated to interact with the hardening agent. Finally, a portion of the developed photoresist layer is converted to a hardened layer where the hardened layer is created by an interaction of the hardening agent with the gas.

In still another embodiment of the invention, a method for curing a photoresist is provided. The method initiates with providing a substrate with a first photoresist layer and a second photoresist layer. The first photoresist layer is developed and disposed over the second photoresist layer and the first photoresist layer is formulated to contain a hardening agent. Next, the first photoresist layer is exposed to a curing environment where the curing environment includes a gas for interacting with the hardening agent. The method terminates after converting a portion of the first photoresist layer to a hardened layer where the hardened layer is configured to increase a selectivity ratio.

In still yet another embodiment a method for curing a photoresist disposed on a wafer within an etch chamber is provided. The method initiates with the introduction of a gas into the chamber through a process gas inlet, where the gas in the etch chamber defines a curing environment. Next, a wafer having a developed photoresist is exposed to the curing environment. Here, the photoresist is formulated so as to contain a hardening agent. Then, the hardening agent interacts with the curing environment, thereby converting a portion of the developed photoresist layer to a hardened layer.

The advantages of the present invention are numerous. Most notably, the formation of the hardened layer increases the selectivity ratio of the underlying photoresist layer or interlayer dielectric relative to the hardened layer of the top photoresist layer. Accordingly, any etch processes performed on the substrate with the hardened layer will etch through the underlying photoresist layer or interlayer dielectric at an increased rate relative to the etch rate of the hardened layer. Furthermore, the etch profile control will be improved as a result of the increased selectivity, thereby allowing for more accurate etch profiles as semiconductor device features continue to shrink. Additionally, an etch chamber may be utilized for curing the hardened layer. As a result, after the curing process, the substrate may be etched in the same chamber. Hence, throughput is increased and handling of the substrate is minimized.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for an apparatus and a method for enhancing the selectivity of a silicon-containing photoresist thereby improving etch profile control. It will be obvious, however, to one skilled in the art, that the present invention may be practiced without some or all of these specific details. In other instances, well known process operations have not been described in detail in order not to unnecessarily obscure the present invention.

The embodiments of the present invention provide an apparatus and method for an improved selectivity of a silicon-containing photoresist which in turn, allows for amelioration of a subsequent etch profile. In one embodiment, a hardened layer is formed in a silicon-containing photoresist in the presence of an oxygen-containing or nitrogen containing curing environment. The hardened layer has an increased selectivity relative to an underlying photoresist layer or an underlying interlayer dielectric ILD. Accordingly, the increased selectivity allows for tighter control of future etching processes, particularly with respect to dual damascene processing. For instance, as device features continue to decrease in size, the aspect ratio of many of the features increases, which in turn makes etching more of a challenge. Just as significant, the formation of the hardened layer can take place in an etch chamber. The etch chamber can be configured to control various process parameters as discussed below. In addition, once the silicon-containing photoresist has been hardened, downstream etching processes may occur in the etch chamber without the need to remove the wafer. Consequently, wafer throughput is increased by combining fabrication steps into a single system.

Figure 1:
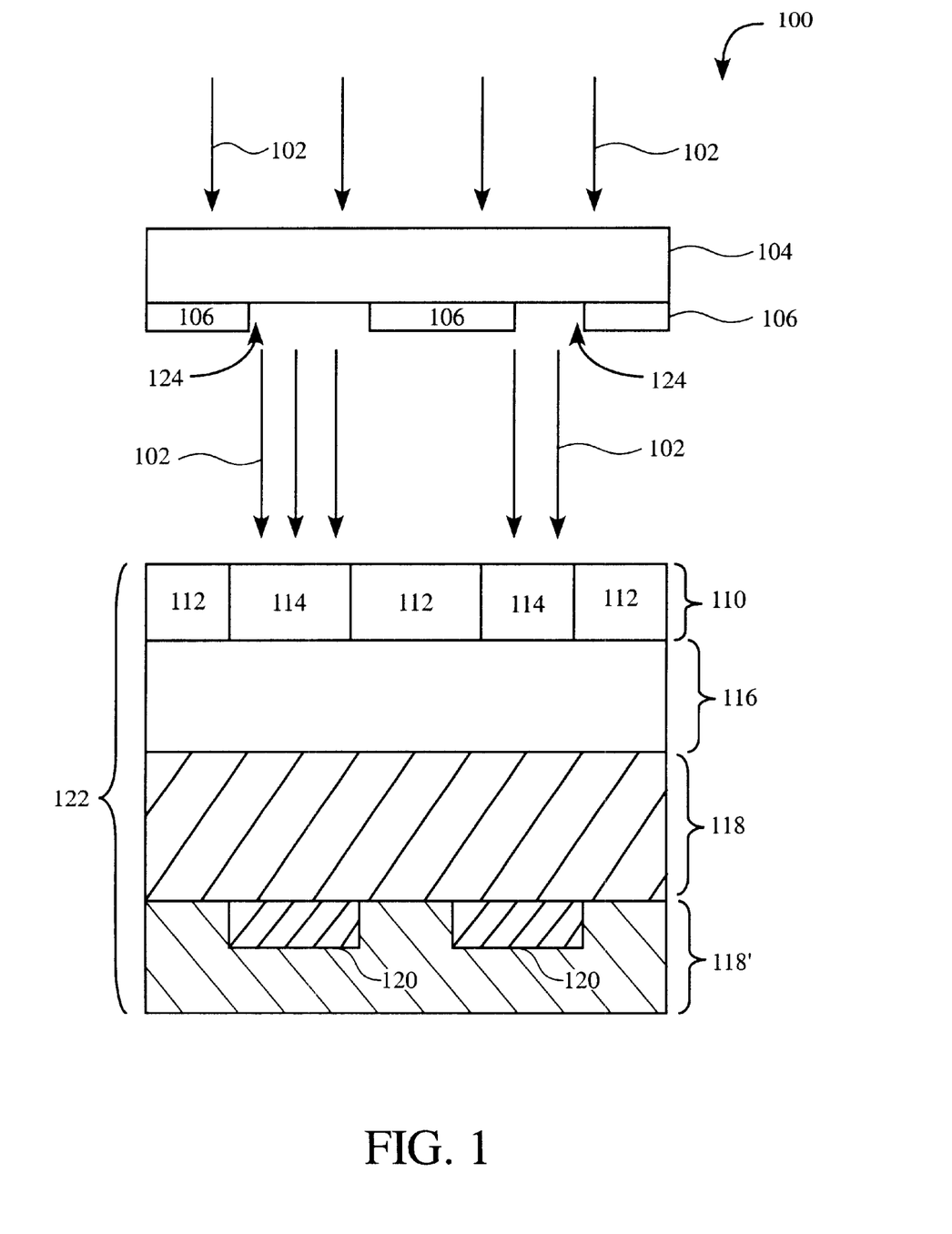
FIG. 1 illustrates a block diagram displaying a substrate in which the top photoresist layer is being exposed prior to development in accordance with one embodiment of the invention.

FIG. 1 illustrates a block diagram 100, displaying a substrate in which the top photoresist layer is being exposed in accordance with one embodiment of the invention. In FIG. 1, light 102 from a light source (not shown) passes through a glass reticle 104. The light 102 will not pass through the reticle in the opaque areas 106. In accordance with one embodiment of the invention, the light 102 is ultraviolet light. It should be appreciated that a mask pattern is applied to the glass reticle 104 in which certain areas allow light 102 to pass through, while others prevent light 102 from passing through, thereby exposing a pattern on the substrate 122. For example, the mask pattern may be formed in emulsion, chrome, iron oxide, silicon and the like. In accordance with one embodiment of the invention, the reticle is a mask containing the full die array needed to define one process layer for the entire wafer.

Continuing with FIG. 1, the light 102 passes through the unblocked areas 124 of the reticle 104 to the substrate 122. The substrate 122 contains a top layer 110 of silicon-containing photoresist over a second layer 116 of a non silicon-containing photoresist. An example of the silicon-containing photoresist is Fuji-film TIS-200-IL-7 and an example of the non silicon-photoresist is Fuji film TIS-200-IL-5, both of which may be purchased from Arch Chemicals, Inc. of Norwalk Conn. As depicted in FIG. 1, the second layer of non silicon-containing oxide resides over an interlayer dielectric (ILD) 118. In accordance with one embodiment of the invention the ILD 118 is silicon dioxide. In a dual-damascene structure, metal lines 120 are formed in another ILD 118'. The metal lines 120 are copper in accordance with one embodiment of the invention. Although, the underlying features can be any features, so long as access is made to them by etching. The etching performance, however, is significantly improved due to the robust selectivity provided by the treating environment, which is disclosed below.

Figure 2:
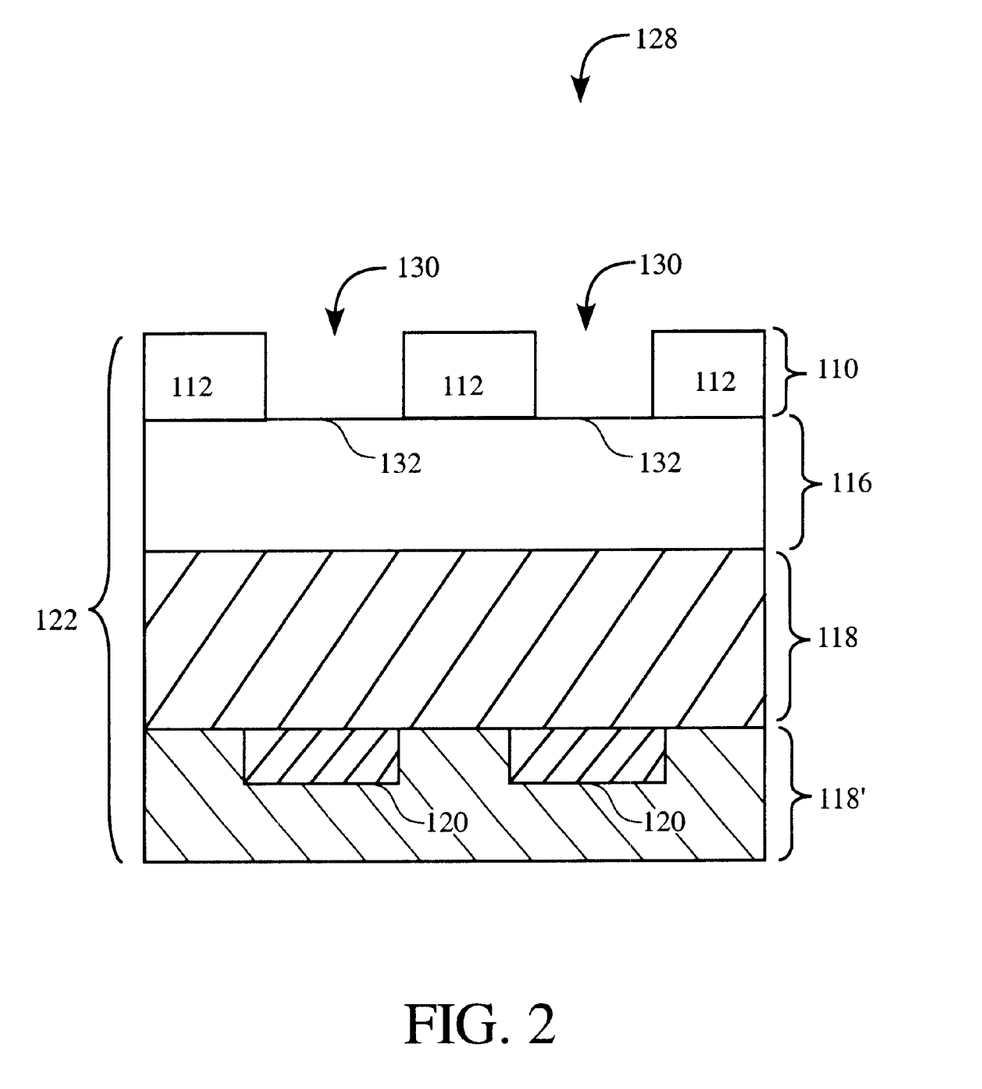
FIG. 2 illustrates block diagram depicting a developed substrate.

FIG. 2 illustrates block diagram 128 depicting a developed substrate 122. The top layer 110 of silicon-containing photoresist has been developed to remove the silicon-containing photoresist from regions 130, which were exposed to light 102 of FIG. 1. Regions 112 of the silicon-containing photoresist remain on the top layer of substrate 122. The bottom layer 116 of non silicon-containing photoresist remains intact. As can be seen in FIG. 2, the development process removed the silicon-containing photoresist to the border 132 between the top layer 110 of photoresist and the bottom layer 116 of photoresist. In accordance with one embodiment of the invention, the development method may be continuous spray development, puddle development, etc. It should be appreciated that the photoresist 114 exposed to light in FIG. 1, becomes more soluble, so that during development the exposed photoresist 114 is removed, as depicted in FIG. 2.

While the above exposure and development of the photoresist has been described for a positive resist, it is understood that the apparatus and method is equally applicable for a negative resist. For example, with a negative resist, the reticle or mask 104 would be modified so as to expose regions 112 and not expose regions 114 of the silicon-containing photoresist layer 110. For this embodiment, the exposed regions 112 become less soluble than unexposed region 114. The negative resist is then developed by a solvent wash of the photoresist layer 110 to remove regions 114 in accordance with one embodiment of the invention.

Figure 3:
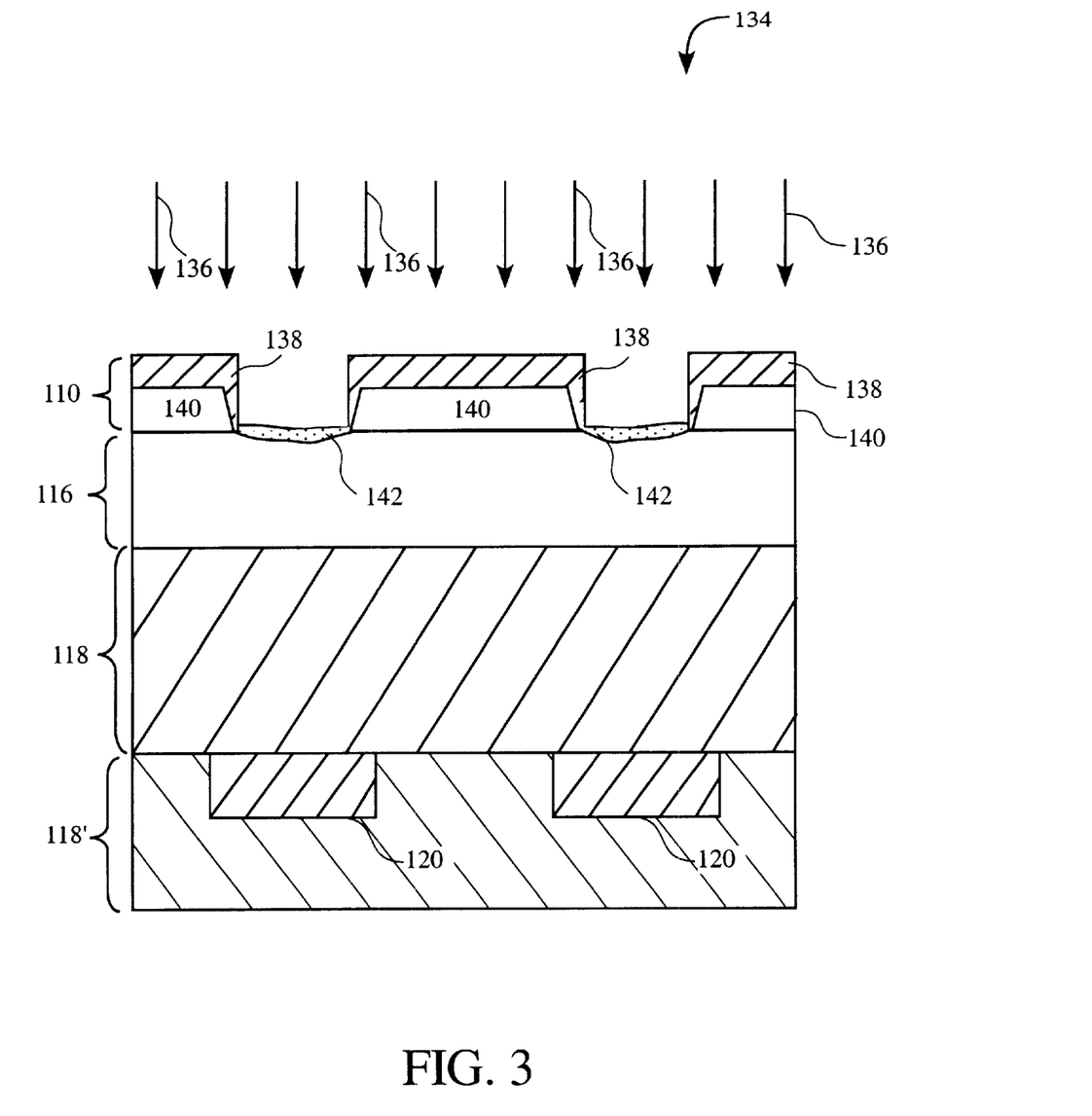
FIG. 3 illustrates block diagram depicting a developed photoresist being subjected to an oxygen or nitrogen-containing atmosphere in accordance with one embodiment of the invention.

FIG. 3 illustrates block diagram 134 depicting a developed photoresist being subjected to an oxygen or nitrogen-containing atmosphere in accordance with one embodiment of the invention. Substrate 122 of diagram 134 contains a top layer 110 of developed silicon-containing photoresist. The substrate 122 is placed into an oxygen ($O_2$) containing or nitrogen ($N_2$) containing atmosphere 136. In one embodiment, the oxygen or nitrogen-containing atmosphere is a plasma. The top photoresist layer 110 of silicon-containing photoresist is exposed to the oxygen or nitrogen-containing atmosphere or plasma 136. For illustration purposes, the oxygen or nitrogen enriched atmosphere or plasma is depicted as arrows 136. In accordance with one embodiment of the invention, the substrate 122 is placed in a plasma enhanced oxygen or nitrogen enriched atmosphere. The flow rate of the oxygen or nitrogen-containing gases may be controlled through the etch chamber controls as will be described in reference to FIG. 5. In still another embodiment of the invention, the nitrogen-containing atmosphere is maintained in the chamber through ammonia gas ($NH_3$) flow.

Continuing with FIG. 3, the oxygen or nitrogen atmosphere interacts with the top layer 110 of the silicon-containing photoresist to form a hardened layer 138. It should be appreciated in the nitrogen atmosphere, the silicon of the silicon-containing atmosphere reacts with the nitrogen to form a layer 138 of silicon nitride ($Si_3N_4$ or $Si_xN_y$). Similarly, while under an oxygen atmosphere, the silicon of the silicon-containing photoresist reacts with the oxygen to form a layer 138 of silicon dioxide ($SiO_2$). Accordingly, the silicon of the silicon-containing photoresist acts as a hardening agent and interacts with the oxygen or nitrogen-containing gas of the curing environment. In a preferred embodiment of the invention, the top layer 110 of silicon-containing photoresist has a thickness of about 2000 Å while the bottom layer 116 of non silicon-containing photoresist has a thickness of about 6000 Å. In a general embodiment, the silicon-containing photoresist has a thickness that ranges between 1000 Å and about 3000 Å, while the bottom layer 116 of non silicon-containing photoresist has a thickness that ranges between about 3000 Å and about 8000 Å. In another embodiment of the invention, the converted layer 138 has a thickness between about 5% to about 75% of the thickness of the original layer 110. In a preferred embodiment of the invention, where the hardened layer is silicon dioxide, the converted layer 138 is about 50% of the thickness of the original layer 110.

As can be seen in diagram 134 the remainder of the top layer of the silicon-containing photoresist is unchanged as depicted by unconverted regions 140. In addition, regions 142 of the lower photoresist layer 116 of non silicon-containing photoresist are exposed to the nitrogen or oxygen containing environment but are not converted because of the lack of silicon in the lower photoresist layer 116. It should be appreciated that the conversion process may take place inside a chamber, such as an etch chamber which has a plurality of gas inlets. In such an embodiment the chamber is configured to control parameters, such as a flow rate of the oxygen or nitrogen containing gases and an inert gas such as argon, helium and xenon etc., a pressure inside the chamber, a temperature inside the chamber and the power of a top and bottom electrode. The preferred ranges for these parameters are discussed in reference to FIG. 5. Just as significant, the use of an etch chamber allows for combining the different fabrication steps i.e., hardening the photoresist layer 110 and downstream etching, in a single system, thereby increasing wafer throughput.

Figure 4:
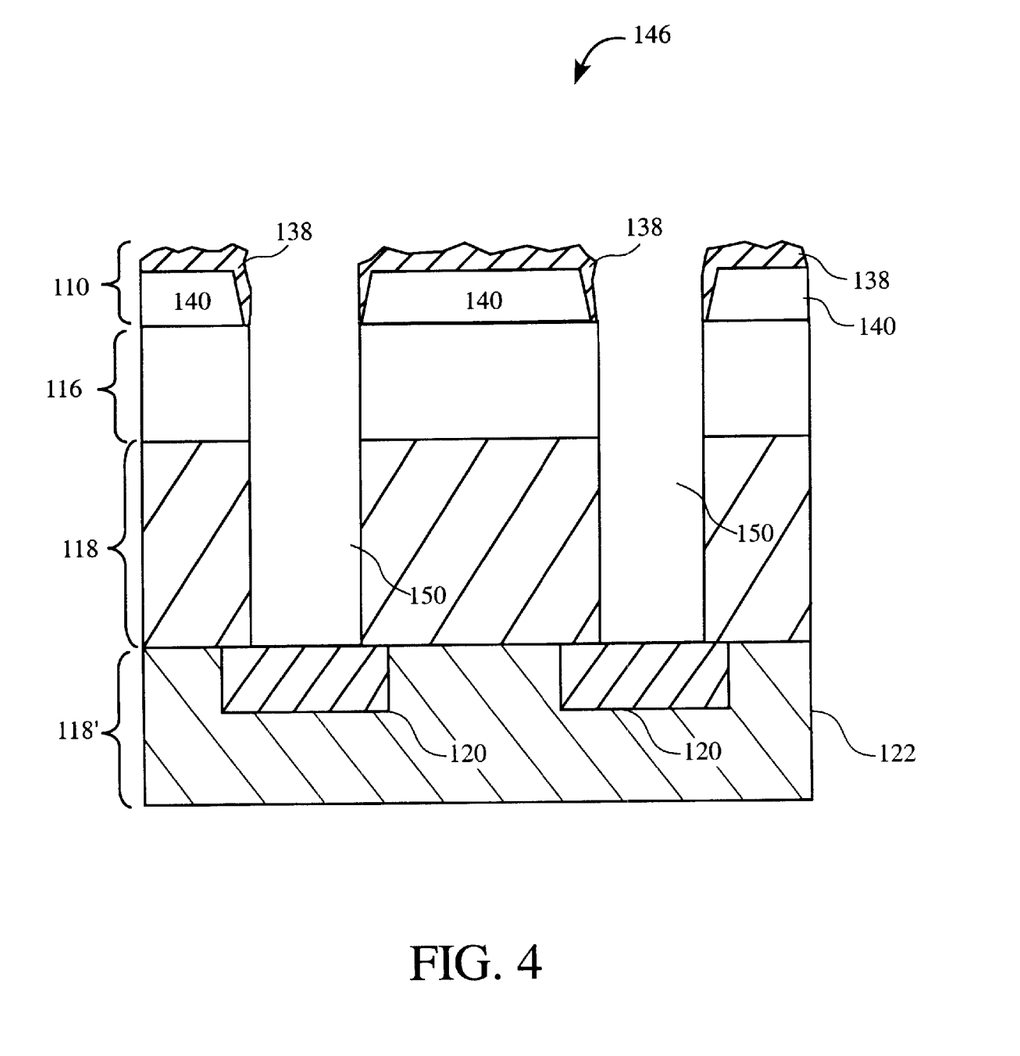
FIG. 4 illustrates block diagram depicting an etched substrate having a post-etched hardened top layer of a silicon-containing photoresist.

FIG. 4 illustrates block diagram 146 depicting an etched substrate having a post-etched hardened top layer 138 of a silicon-containing photoresist. Block diagram 146 displays etch profiles 150 which have been etched into substrate 122. It should be appreciated that either dry etch or wet etch processes can be used to create etch profile for via 150. As depicted by FIG. 4, the hardened layer 138 of the top layer 110 of silicon-containing photoresist shows the effects of the etching process, where the thickness of the hardened layer 138 has been decreased through the etching process. In accordance with one embodiment of the invention, the etching process is part of a dual damascene process where the interlayer dielectric 118 is etched down to copper metallization line 120. It should be appreciated that for a dual damascene process the etch may proceed through multiple dielectrics so that copper interconnect wiring may be formed.

FIG. 4 displays a via 150 etched through the dielectric to the copper metallization line 120. It can be appreciated that as devices further decrease in size, the aspect ratio of the vias, i.e., the ratio of the via depth to its width, increases. The higher aspect ratios require highly accurate etching to ensure device performance. As the aspect ratio increases the etching selectivity of the photoresists need to increase to adequately protect the underlying dielectric. While FIG. 4 demonstrates a portion of the hardened layer 138 remaining on the substrate 122, if the selectivity of the hardened layer of the was not increased through the invention described herein, then the etching process may etch through photoresist layers 110 and 116 into the dielectric 118. Accordingly, the further miniaturization of device features will continue to increase aspect ratios of the same features. As such, increasing the etching selectivity, as described herein, will ensure underlying layers are adequately protected during the etching process. While FIG. 4 depicts an etch of a via to the copper interconnects, it should be understood that hardened photoresist layer 138 is applicable for any type of dual damascene process including via first, trench first and self aligned processes Still referring to FIG. 4, in accordance with one embodiment of the invention, the etch rate of the hardened layer 138 of the top layer 110 of the silicon-containing photoresist relative to the etch rate of the non silicon-containing photoresist layer 116 decreases. Likewise, the etch rate of the hardened layer 138 relative to the etch rate of the ILD 118 decreases. Accordingly, the selectivity ratio ($S_r$), defined by the etch rate of the film undergoing the etch ($E_f$) divided by the etch rate of the photoresist ($E_r$), increases. The higher selectivity translates to the etching occurring on the desired layers, i.e., the material under the hardened layer 138 is shielded during etching as the etch rate of the hardened layer is smaller than the etch rate of the non silicon-containing photoresist 116 or the ILD 118. In accordance with one embodiment of the invention, the selectivity ratio ($S_r$) of a silicon dioxide hardened layer and the non silicon-containing photoresist is between about 8 and about 15. In accordance with another embodiment of the invention, the selectivity ratio ($S_r$) of a silicon nitride hardened layer and the non silicon-containing photoresist is between about 6 and about 10. As further illustrated in FIG. 4, the hardened layer 138 effectively shields the layers below it. It should be appreciated that in this embodiment, even if the hardened layer is etched away completely during the etching process, the non silicon-containing layer is still available to shield the appropriate areas of the substrate from the etching process.

Figure 5:
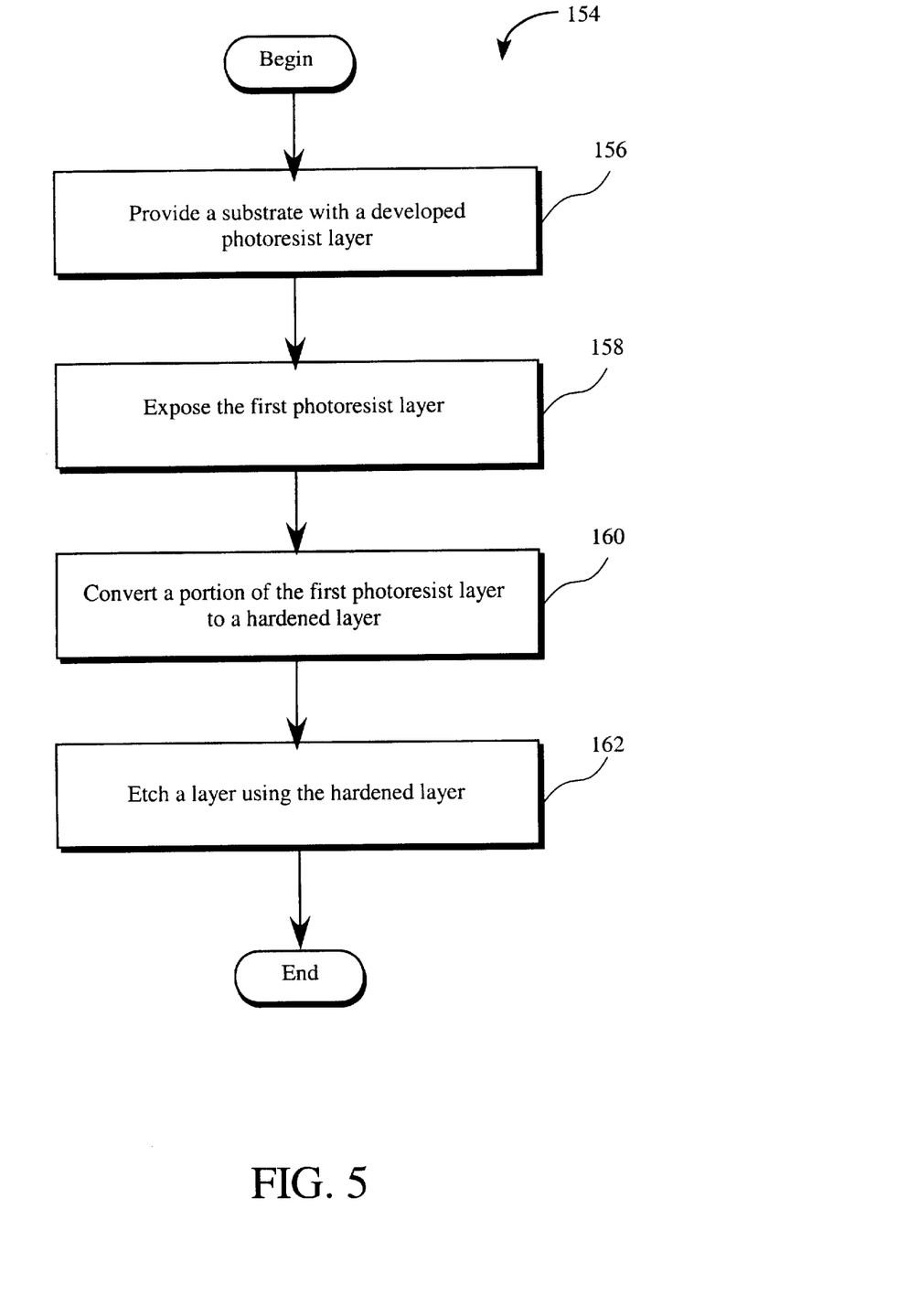
FIG. 5 illustrates flowchart depicting a method for increasing a silicon-containing photoresist selectivity in accordance with one embodiment of the invention.

FIG. 5 illustrates flowchart 154 depicting a method for increasing a silicon-containing photoresist selectivity in accordance with one embodiment of the invention. Flowchart 154 initializes with operation 156 where a substrate with a developed photoresist is provided. Here, the substrate may include one or more photoresists with the top photoresist being developed as discussed in reference to FIG. 1. In accordance with one embodiment of the invention, the developed photoresist is a silicon-containing photoresist.

Flowchart 154 then proceeds to operation 158 where the top photoresist layer is exposed to a curing environment. Here, the curing environment may be inside an etch chamber. Accordingly, the substrate will rest on a support within the chamber such as a chuck. In accordance with one embodiment of the invention, the curing environment is a oxygen or nitrogen-containing plasma. For example, an oxygen or nitrogen containing gas is introduced into the etch chamber through process gas inlets, thereby creating the curing environment when the plasma is struck. In a preferred embodiment, oxygen ($O_2$) is provided to the etch chamber to create the oxygen containing curing environment. Other oxygen containing gases that may be used include carbon monoxide (CO), carbon dioxide ($CO_2$), nitrous oxide ($N_2O$) and nitrogen dioxide ($NO_2$). In another embodiment of the invention, the nitrogen containing gas is ammonia gas ($NH_3$). Other nitrogen containing gases that may be used include nitric oxide (NO), nitrous oxide ($N_2O$) and nitrogen dioxide ($NO_2$). It should be further appreciated that the creation of the hardening layer may be initiated by striking a plasma within the etch chamber and controlling certain parameters inside the etch chamber as discussed below. In this embodiment, the gases would be introduced into the etch chamber along with an inert carrier gas such as argon.

As is well known in the art, etch chambers are capable of controlling various parameters. In accordance with one embodiment of the invention, the flow rate of the process gases, the pressure and temperature within the chamber, and the power to the top and bottom electrodes are controlled within the ranges that follow. It should be appreciated that the following ranges are provided for illustration purposes only. The flow rate for an oxygen containing gas, such as $O_2$, is between about 50 standard cubic centimeters per minute (sccm) and 500 sccm with a preferred flow rate of about 100 sccm. The flow rate for a nitrogen containing gas, such as ammonia gas $NH_3$, is between about 100 sccm to 2000 sccm with a preferred flow rate of about 1000 sccm. The pressure within the chamber is controlled between about 50 millitorr (mT) and about 300 mT with a preferred pressure of about 150 mT. The temperature within the chamber is controlled between about −30° Celsius (C.) and about 70° C. with a preferred temperature of about 0° C. The power to the top electrode is between about 100 watts (W) and about 1500 W with a preferred power of 500 W. The power to the bottom electrode is between about 0 W to about 1000 W with a preferred power of 0 W. Finally, the flow rate of an inert gas, such as argon, is between about 300 sccm to about 1000 sccm with a preferred flow rate of 500 sccm. It should be appreciated that the above ranges may vary in different etch chambers.

Returning back to FIG. 5, following operation 158 the method advances to operation 160, where a portion of the first photoresist layer is converted to a hardened layer. In a preferred embodiment of the invention when the curing environment is an oxygen-containing gas, the hardened layer is silicon dioxide ($SiO_2$). In another embodiment of the invention, where the curing environment is a nitrogen-containing gas, the hardened layer is silicon nitride ($Si_3N_4$ or $Si_xN_y$). As mentioned previously, the oxygen or nitrogen-containing gas of the curing environment interacts with the hardening agent of the top photoresist layer to form a silicon dioxide or silicon nitride layer. In one embodiment of the invention the hardening agent of the top photoresist is silicon. Finally the method terminates with operation 162, where an etch is performed using the hardened layer. Here, a via may be etched as shown in FIG. 4. Alternatively, a trench may be etched and silicon containing photoresist applied and hardened, as described above, to define a region for etching a via.

As described above in reference to FIG. 3, the hardened layer 138 has a thickness of about 50% of the original thickness of the silicon-containing photoresist layer. It should be appreciated that the hardened layer 138 of the substrate will improve the selectivity for future etching of the substrate 122. In other words, the selectivity of the hardened layer relative to the bottom photoresist layer 116 and the ILD 118 is increased, thereby ensuring optimal critical dimension and profile control. In a preferred embodiment of the invention, where the hardened layer is silicon dioxide, the selectivity ratio between the hardened layer and the non silicon-containing photoresist or the ILD is between about 8 to about 15. In another embodiment of the invention, where the hardened layer is silicon nitride, the selectivity ratio between the hardened layer and the non silicon-containing photoresist or the ILD is between about 6 to about 10.

It should be appreciated that the above described invention may be employed with a single silicon-containing photoresist layer is used without an underlying photoresist layer being applied to the substrate. Also, as mentioned above the invention may be utilized as part of a dual damascene process or traditional metallization processes where aluminum alloy forms the metal lines.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for increasing a selectivity of a photoresist, comprising:

providing a substrate with a developed silicon-containing photoresist layer disposed over a non-silicon containing photoresist layer, the developed silicon-containing photoresist layer being formulated to contain a hardening agent;

exposing the substrate and the developed photoresist layer to a gas, the gas being formulated to interact with the hardening agent; and converting a top portion of the developed silicon-containing photoresist layer to a hardened layer, the hardened layer being created by an interaction of the hardening agent with the gas.

2. The method as recited in claim 1, wherein the gas is one of oxygen and ammonia.

3. The method as recited in claim 1, wherein the hardening agent is silicon.

4. The method as recited in claim 1, wherein the hardened layer is one of silicon dioxide and silicon nitride.

5. The method as recited in claim 1, wherein about 5% and about 75% of a top portion of the developed silicon-containing photoresist layer is converted to the hardened layer.

6. The method as recited in claim 5, wherein the method operation of exposing the substrate and the develop photoresist layer to a gas further includes, placing the substrate in an etch chamber; and controlling a flow rate of the gas to the chamber between about 100 sccm and about 2000 sccm.

7. The method as recited in claim 5 further including, controlling a pressure of the chamber between about 50 mT and about 300 mT; and controlling a temperature of the chamber between about −30° C. and about 70° C.

8. The method as recited in claim 1, wherein the portion of the developed photoresist layer converted to the hardened layer is between about 5% and about 75% of the photoresist layer.

9. A method for curing a portion of a photoresist layer, comprising:

providing a substrate with a first photoresist layer and a second photoresist layer, the first photoresist layer being developed and disposed over the second photoresist layer, the first photoresist layer being formulated to contain a hardening agent;

exposing the first photoresist layer to a nitrogen based curing environment, the nitrogen based curing environment interacting with the hardening agent; and converting a top portion of the first photoresist layer to a nitride based hardened layer through the interaction of the nitrogen based curing environment and the hardening agent, the nitride based hardened layer being formed to increase an etching selectivity ratio between the first photoresist layer and the second photoresist layer.

10. The method for curing a portion of a photoresist as recited in claim 9, wherein the hardening agent is silicon.

11. The method for curing a portion of a photoresist as recited in claim 9, wherein the nitrogen based curing environment is provided by a gas selected from the group consisting of ammonia, nitric oxide, nitrous oxide and nitrogen dioxide.

12. The method for curing a portion of a photoresist as recited in claim 9, further including:

placing the substrate in an etch chamber;

controlling a flow rate of the gas to the chamber between about 100 sccm and about 2000 sccm;

controlling a pressure of the chamber between about 50 mT and about 300 mT; and controlling a temperature of the chamber between about −30° C and about 70° C.

13. The method for curing a portion of a photoresist as recited in claim 9, wherein the selectivity ratio is between about 6 and about 10.

14. In an etch chamber having a top and a bottom electrode, process gas inlets, and a chuck for holding a wafer, the wafer including a dielectric layer to be etched, a method for curing a photoresist disposed on the wafer, comprising:

introducing a gas into an etch chamber through a process gas inlet, the gas in the etch chamber defining a nitrogen based curing environment;

exposing the wafer to the nitrogen based curing environment, the wafer having a developed photoresist layer containing a hardening agent, the developed photoresist layer disposed over a non-hardening agent photoresist layer;

interacting the hardening agent with the nitrogen based curing environment; and converting a top portion of the developed photoresist layer to a nitride based hardened layer.

15. The method for curing a photoresist as recited in claim 14, wherein the gas is selected from the group consisting of ammonia, nitric oxide, nitrous oxide and nitrogen dioxide.

16. The method for curing a photoresist as recited in claim 14, wherein the hardening agent is silicon.

17. The method for curing a photoresist as recited in claim 14, further comprising:

controlling a gas flow rate, a temperature of the etch chamber, a pressure of the etch chamber, and a power supply to the top and the bottom electrode.

18. The method for curing a photoresist as recited in claim 14, wherein the top portion of the developed photoresist layer converted to a hardened layer is between about 5% and about 75% of the developed photoresist layer.

19. The method for curing a photoresist as recited in claim 17 further including:

controlling a flow rate of the gas to the chamber between about 100 sccm and about 2000 sccm;

controlling a pressure of the chamber between about 50 mT and about 300 mT; and controlling a temperature of the chamber between about −30° C. and about 70° C.

20. The method for curing a photoresist as recited in claim 17, wherein the power to the bottom electrode is maintained at between about 0 watts and 1000 watts.

* * * * *